(12) United States Patent
Wang

(10) Patent No.: US 12,520,476 B2
(45) Date of Patent: Jan. 6, 2026

(54) SEMICONDUCTOR DEVICE AND METHOD OF MANUFACTURING THE SAME

(71) Applicant: NANYA TECHNOLOGY CORPORATION, New Taipei (TW)

(72) Inventor: Wen-Chieh Wang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 519 days.

(21) Appl. No.: 18/156,417

(22) Filed: Jan. 19, 2023

(65) Prior Publication Data

US 2024/0251542 A1 Jul. 25, 2024

(51) Int. Cl.
*H10B 12/00* (2023.01)

(52) U.S. Cl.
CPC .................................. *H10B 12/03* (2023.02)

(58) Field of Classification Search
CPC .............................. H10B 12/03; H10B 12/033
See application file for complete search history.

(56) References Cited

U.S. PATENT DOCUMENTS

2022/0028966 A1  1/2022  Wu
2024/0008245 A1*  1/2024  Jin ..................... H01L 21/3213

FOREIGN PATENT DOCUMENTS

TW          202141700 A     11/2021

* cited by examiner

*Primary Examiner* — Edward Chin
(74) *Attorney, Agent, or Firm* — CKC & Partners Co., LLC

(57) ABSTRACT

The present disclosure provides a method of manufacturing a semiconductor device. The method includes: sequentially forming a first supporting layer, a first mold layer, and a second supporting layer on a surface of a substrate; forming a plurality of first openings on the second supporting layer to expose the first mold layer; sequentially forming a second mold layer and a third supporting layer on the second supporting layer including the first openings; forming a plurality of second openings on the third supporting layer to expose the second mold layer; filling a mold material in the second openings; forming a plurality of trenches to expose the substrate, and the trenches are separated from the second openings; conformally forming a conductive layer on inner sidewalls of the trenches; and removing the mold material, the second mold layer, and the first mold layer.

16 Claims, 19 Drawing Sheets

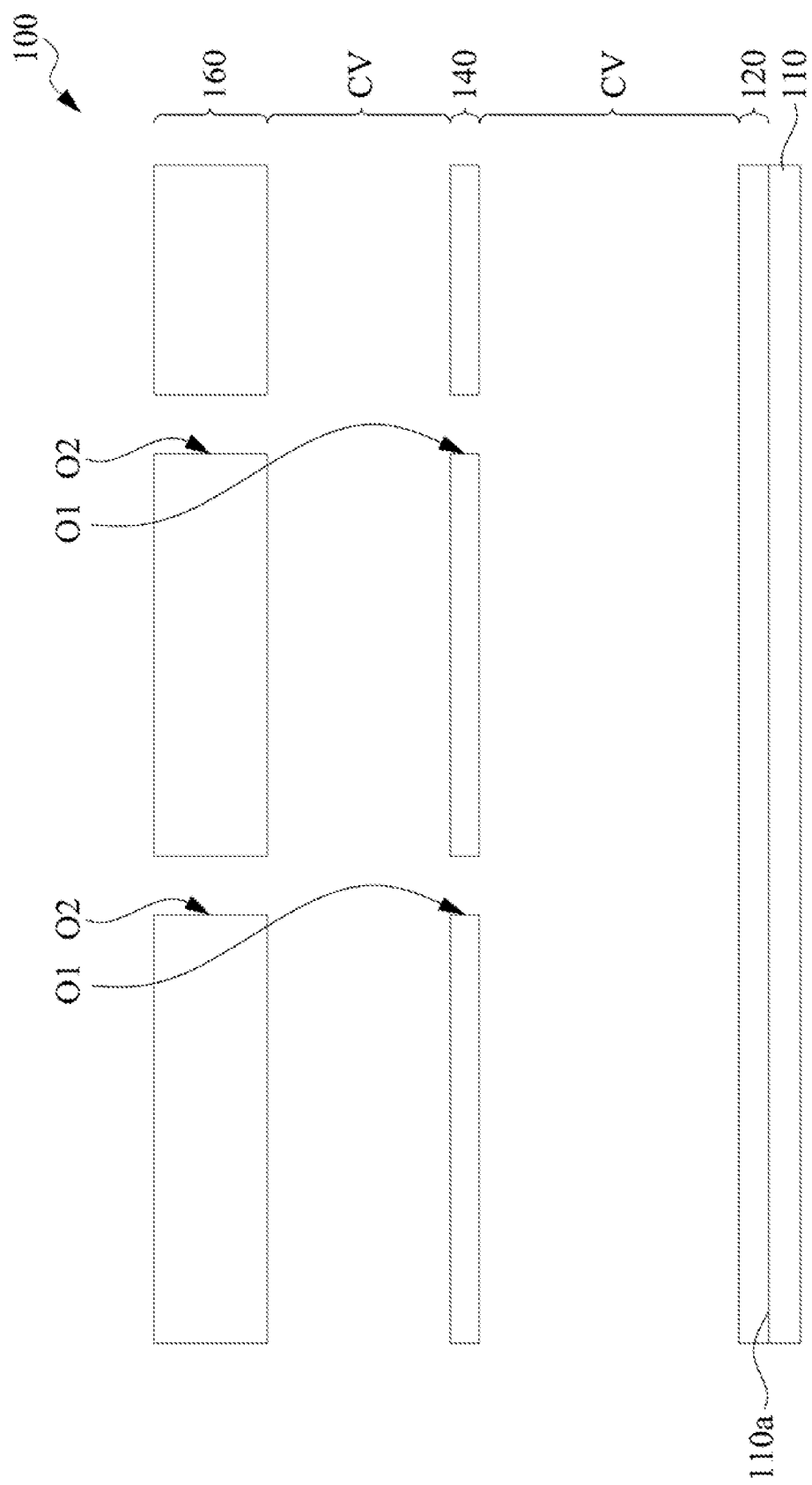

SEMICONDUCTOR DEVICE AND METHOD OF MANUFACTURING THE SAME

BACKGROUND

Field of Invention

The present disclosure relates to a semiconductor device and a method of manufacturing the same.

Description of Related Art

For dynamic random access memory (DRAM) double-side capacitor formation, supporting nitride is the key for structure supporting. Generally, dual-support nitride layers are inserted in mold oxides which are called middle support silicon nitride ($Si_xN_y$) and top support silicon nitride for structure supporting. The previous method includes a capacitor mold oxide removal process, a top support silicon nitride dry etch, a second mold oxide wet etch, a middle support silicon nitride dry etch, and a first mold oxide wet etch. However, a bottom electrode of capacitor will be consumed during the top support silicon nitride dry etch process and the first mold oxide wet etch process. More top loss of the bottom electrode will reduce series capacitance (Cs) of capacitor. Therefore, to reduce the bottom electrode loss will help building healthy capacitor structure to avoid capacitor to capacitor short issue.

SUMMARY

In view of this, one purpose of present disclosure is to provide a semiconductor device and a method of manufacturing the same that can solve the aforementioned problems.

In order to achieve the above objective, according to an embodiment of the present disclosure, a method of manufacturing a semiconductor device includes: sequentially forming a first supporting layer, a first mold layer, and a second supporting layer on a surface of a substrate, in which the first mold layer is formed sandwiched between the first supporting layer and the second supporting layer; forming a plurality of first openings on the second supporting layer to expose the first mold layer; sequentially forming a second mold layer and a third supporting layer on the second supporting layer including the first openings, so that the second mold layer contacts the first mold layer; forming a plurality of second openings on the third supporting layer to expose the second mold layer, in which the second openings are formed directly above the first openings; filling a mold material in the second openings, in which the mold material is identical to the second mold layer; forming a plurality of trenches to expose the substrate, in which the trenches run through the first supporting layer, the first mold layer, the second supporting layer, the second mold layer, and the third supporting layer, and the trenches are separated from the second openings; conformally forming a conductive layer on inner sidewalls of the trenches; and removing the mold material, the second mold layer, and the first mold layer.

In one or more embodiments of the present disclosure, the second openings are respectively aligned with the first openings in a direction substantially perpendicular to the surface of the substrate.

In one or more embodiments of the present disclosure, a material of the first mold layer is identical to a material of the second mold layer.

In one or more embodiments of the present disclosure, each of the second openings is surrounded by three of the trenches.

In one or more embodiments of the present disclosure, filling the mold material in the second openings further includes: overfilling the mold material in the second openings; and planarizing the mold material, so that the mold material is leveled with the third supporting layer.

In one or more embodiments of the present disclosure, the method further comprises removing portions of the conductive layer to expose the third supporting layer and the mold material.

In one or more embodiments of the present disclosure, removing the portions of the conductive layer is performed by a chemical mechanical planarization process.

In one or more embodiments of the present disclosure, removing the mold material, the second mold layer, and the first mold layer is performed by a wet etch process.

In order to achieve the above objective, according to an embodiment of the present disclosure, a method of manufacturing a semiconductor device includes: sequentially forming a first supporting layer, a first mold layer, and a second supporting layer on a surface of a substrate, in which the first mold layer is formed sandwiched between the first supporting layer and the second supporting layer; forming a plurality of first openings on the second supporting layer to expose the first mold layer; sequentially forming a second mold layer and a third supporting layer on the second supporting layer including the first openings, so that the second mold layer contacts the first mold layer; forming a plurality of second openings on the third supporting layer to expose the first mold layer, in which the second openings are formed directly above the first openings; filling a mold material in the second openings, in which the mold material is identical to the second mold layer; forming a plurality of trenches to expose the substrate, in which the trenches are separated from the second openings, in which each of the second openings is surrounded by three of the trenches; conformally forming a conductive layer on inner sidewalls of the trenches; and removing the mold material, the second mold layer, and the first mold layer.

In one or more embodiments of the present disclosure, the second openings are respectively aligned with the first openings in a direction substantially perpendicular to the surface of the substrate.

In one or more embodiments of the present disclosure, a material of the first mold layer is identical to a material of the second mold layer.

In one or more embodiments of the present disclosure, the first mold layer, the second mold layer, and the mold material are made of oxide.

In one or more embodiments of the present disclosure, the trenches run through the first supporting layer, the first mold layer, the second supporting layer, the second mold layer, and the third supporting layer.

In one or more embodiments of the present disclosure, filling the mold material in the second openings further includes: overfilling the mold material in the second openings; and planarizing the mold material, so that the mold material is leveled with the third supporting layer.

In one or more embodiments of the present disclosure, the method further comprises removing portions of the conductive layer to expose the third supporting layer and the mold material, in which removing the portions of the conductive layer is performed by a chemical mechanical planarization process.

In one or more embodiments of the present disclosure, removing the mold material, the second mold layer, and the first mold layer is performed by a wet etch process.

In order to achieve the above objective, according to an embodiment of the present disclosure, a semiconductor device includes a substrate, a first supporting layer, a second supporting layer, a third supporting layer, and a conductive layer. The first supporting layer is disposed on a surface of the substrate. The second supporting layer is disposed over the first supporting layer and including a plurality of first openings. The second supporting layer and the first supporting layer are separated. The third supporting layer is disposed over the second supporting layer and includes a plurality of second openings. The third supporting layer and the second supporting layer are separated. The first supporting layer, the second supporting layer, and the third supporting layer are separated by a cavity. Each of the first openings is aligned with each of the second openings in a direction substantially perpendicular to the surface of the substrate. The conductive layer is disposed on the surface of the substrate and sidewalls of the first supporting layer, sidewalls of the second supporting layer, and sidewalls of the third supporting layer.

In one or more embodiments of the present disclosure, the conductive layer runs through the cavity.

In one or more embodiments of the present disclosure, the first supporting layer, the second supporting layer, and the third supporting layer are made of nitride.

In one or more embodiments of the present disclosure, a width of each of the first openings is identical to a width of the each of the second openings.

In summary, in the semiconductor device and the method of manufacturing the same of present disclosure, since the third supporting layer dry etch and the second supporting layer dry etch after bottom electrode deposition are excluded, the conductive layer is no longer consumed, thereby improving cell capacitance of the DRAM. In the semiconductor device and the method of manufacturing the same of present disclosure, since no extra third supporting layer is etched after the conductive layer deposition, the structure of the capacitors will be stronger to avoid capacitor to capacitor short issue, thereby improving its electrical performance.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows:

FIG. 19 is a cross-sectional view along a section B-B' shown in FIG. 17 of an intermediate stage of manufacturing the semiconductor device in accordance with an embodiment of present disclosure.

DETAILED DESCRIPTION

Figure 1:
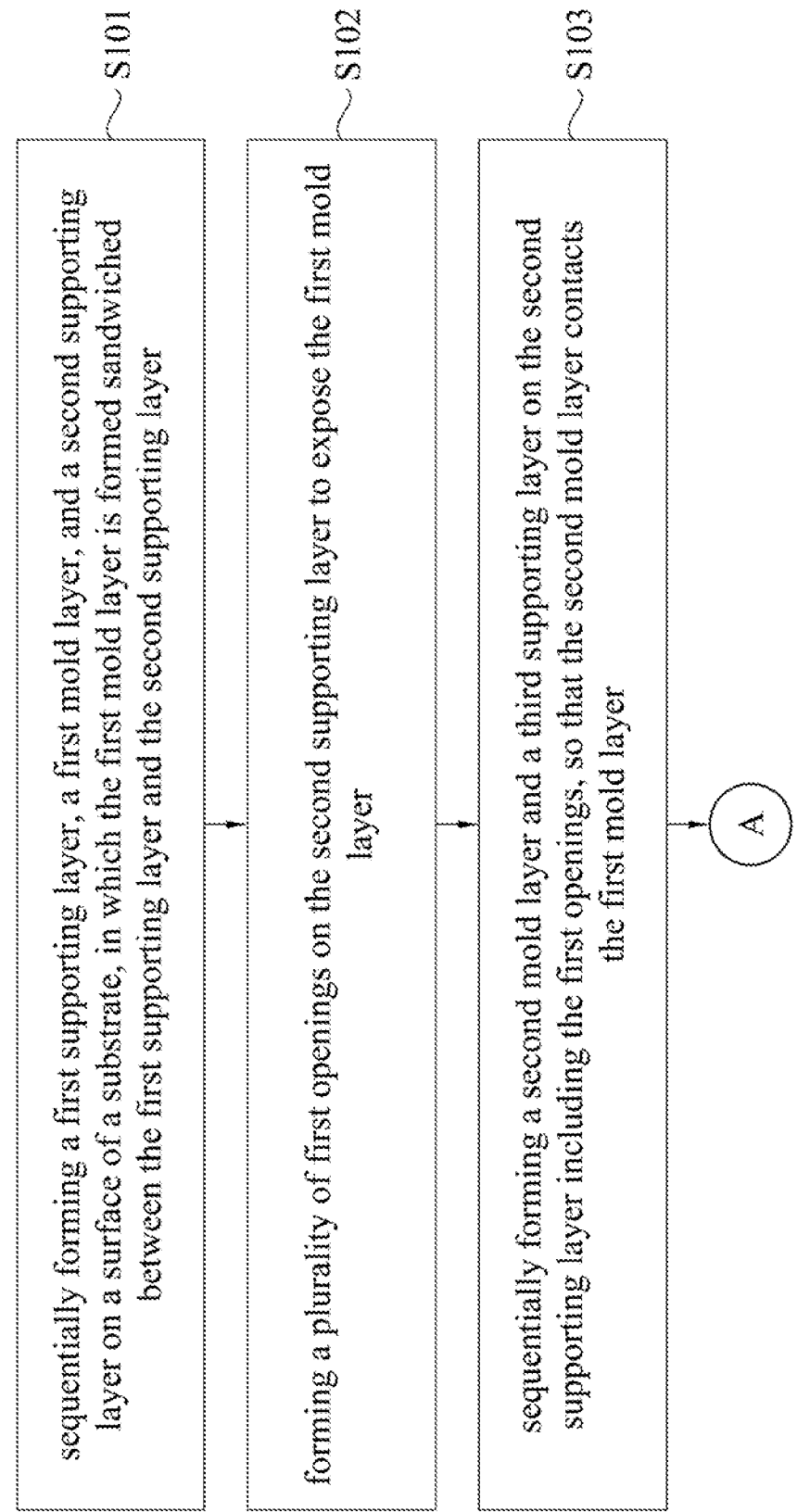
FIG. 1 is a flow chart of a method of manufacturing a semiconductor device in accordance with an embodiment of present disclosure.

Reference will now be made in detail to the present embodiments of the present disclosure, examples of which are illustrated in the accompanying drawings. Wherever possible, the same reference numbers are used in the drawings and the description to refer to the same or like parts.

Figure 2:
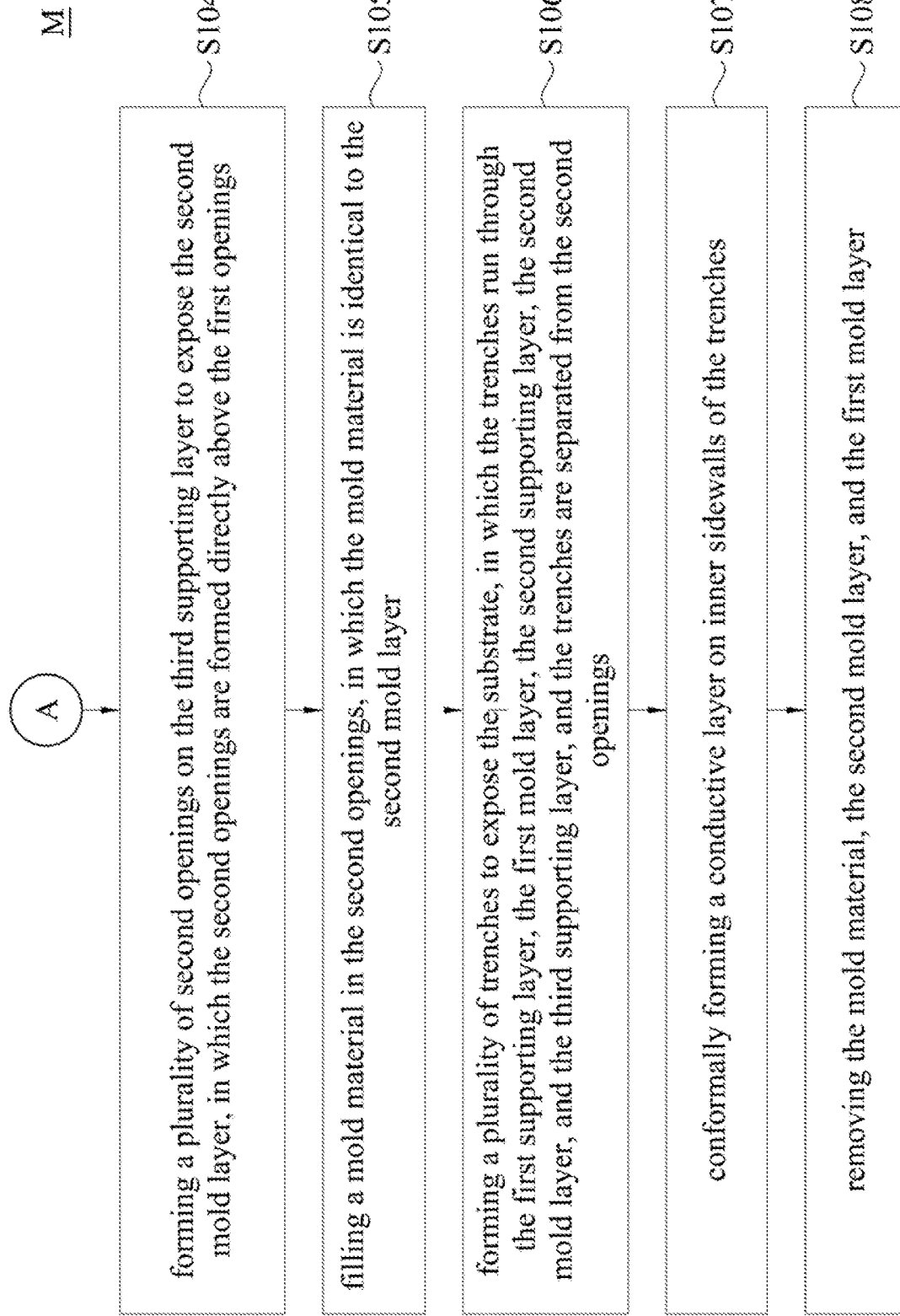
FIG. 2 is a flow chart continued from FIG. 1 of the method of manufacturing the semiconductor device in accordance with an embodiment of present disclosure.

Reference is made to FIG. 1 and FIG. 2. FIG. 1 and FIG. 2 are flow charts of a method M of manufacturing a semiconductor device 100 as shown in FIG. 17 in accordance with an embodiment of present disclosure. The method M shown in FIG. 1 and FIG. 2 includes a step S101, a step S102, a step S103, a step S104, a step S105, a step S106, a step S107, and a step S108. Please refer to FIG. 1, FIG. 3, and FIG. 4 for better understanding the step S101, refer to FIG. 1, FIG. 5, and FIG. 6 for better understanding the step S102, refer to FIG. 1, FIG. 7, and FIG. 8 for better understanding the step S103, refer to FIG. 2, FIG. 9, and FIG. 10 for better understanding the step S104, refer to FIG. 2, FIG. 11, and FIG. 12 for better understanding the step S105, refer to FIG. 2, FIG. 13, and FIG. 14 for better understanding the step S106, refer to FIG. 2, FIG. 15, and FIG. 16 for better understanding the step S107, and refer to FIG. 2, FIG. 17, FIG. 18, and FIG. 19 for better understanding the step S108. In some embodiments, Step S101, step S102, step S103, step S104, step S105, step S106, step S107, and step S108 are performed step by step. However, any suitable order of performing the steps may be utilized.

Step S101, step S102, step S103, step S104, step S105, step S106, step S107, and step S108 are described in detail below.

In step S101, a first supporting layer 120, a first mold layer 130, and a second supporting layer 140 are sequentially formed on a surface 110a of a substrate 110.

Figure 3:
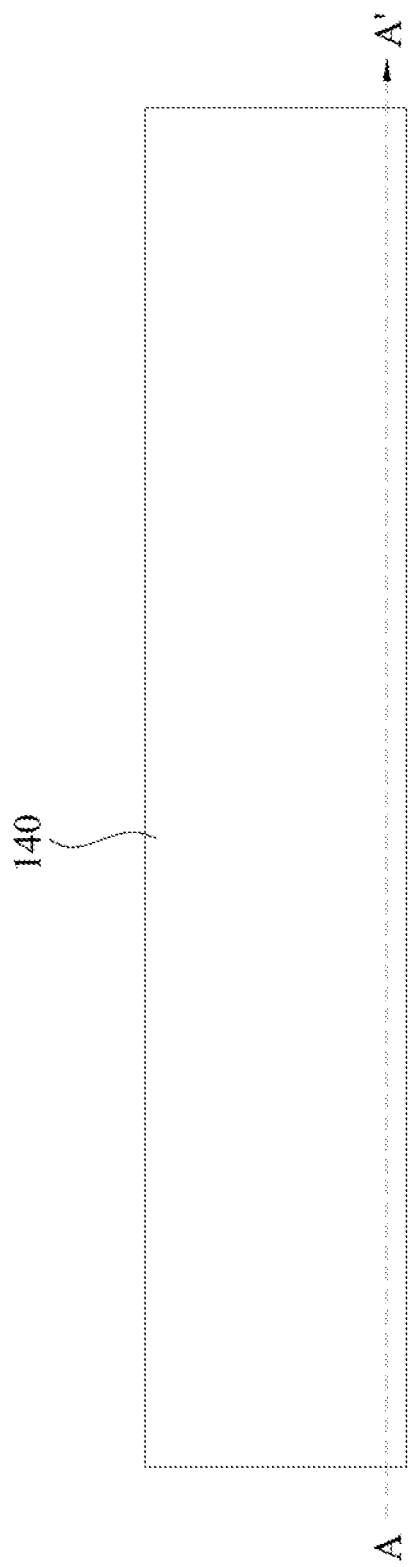
FIG. 3 is a top view of an intermediate stage of manufacturing the semiconductor device in accordance with an embodiment of present disclosure.
Figure 4:
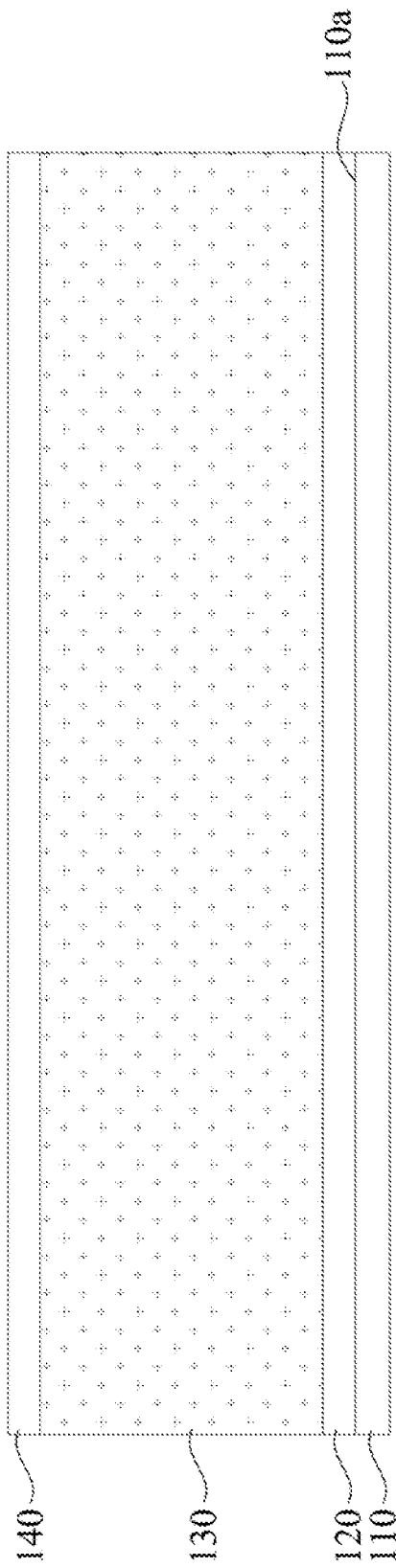
FIG. 4 is a cross-sectional view along a section A-A' shown in FIG. 3 of an intermediate stage of manufacturing the semiconductor device in accordance with an embodiment of present disclosure.

Reference is made to FIG. 1, FIG. 3, and FIG. 4. FIG. 3 is a top view of an intermediate stage of manufacturing the semiconductor device 100 in accordance with an embodiment of present disclosure, whereas FIG. 4 is a cross-sectional view along a section A-A' shown in FIG. 3 of an intermediate stage of manufacturing the semiconductor device 100 in accordance with an embodiment of present disclosure. As shown in FIG. 4, the substrate 110 is provided. The first supporting layer 120 is formed on the surface 110a of the substrate 110. The first mold layer 130 is formed on the first supporting layer 120. The second supporting layer 140 is formed over the first supporting layer 120. The second supporting layer 140 is formed on the first mold layer 130. The first supporting layer 120 is disposed sandwiched between the substrate 110 and the first mold layer 130. The first mold layer 130 is disposed sandwiched between the first supporting layer 120 and the second supporting layer 140.

In some embodiments, the substrate 110 may include a material, such as silicon-based material. However, any suitable material may be utilized.

In some embodiments, the substrate 110 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the substrate 110.

In some embodiments, the first supporting layer 120 may include a nitride material, such as silicon nitride ($Si_xN_y$). However, any suitable material may be utilized.

In some embodiments, the first supporting layer 120 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the first supporting layer 120.

In some embodiments, the first mold layer 130 may include an oxide material, such as silicon oxide ($SiO_2$). However, any suitable material may be utilized.

In some embodiments, the first mold layer 130 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the first mold layer 130.

In some embodiments, the second supporting layer 140 may include a nitride material, such as silicon nitride ($Si_xN_y$). However, any suitable material may be utilized.

In some embodiments, the second supporting layer 140 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the second supporting layer 140.

In some embodiments, the material of the first supporting layer 120 is identical to the material of the second supporting layer 140.

In step S102, a plurality of first openings O1 are formed on the second supporting layer 140 to expose the first mold layer 130.

Figure 5:
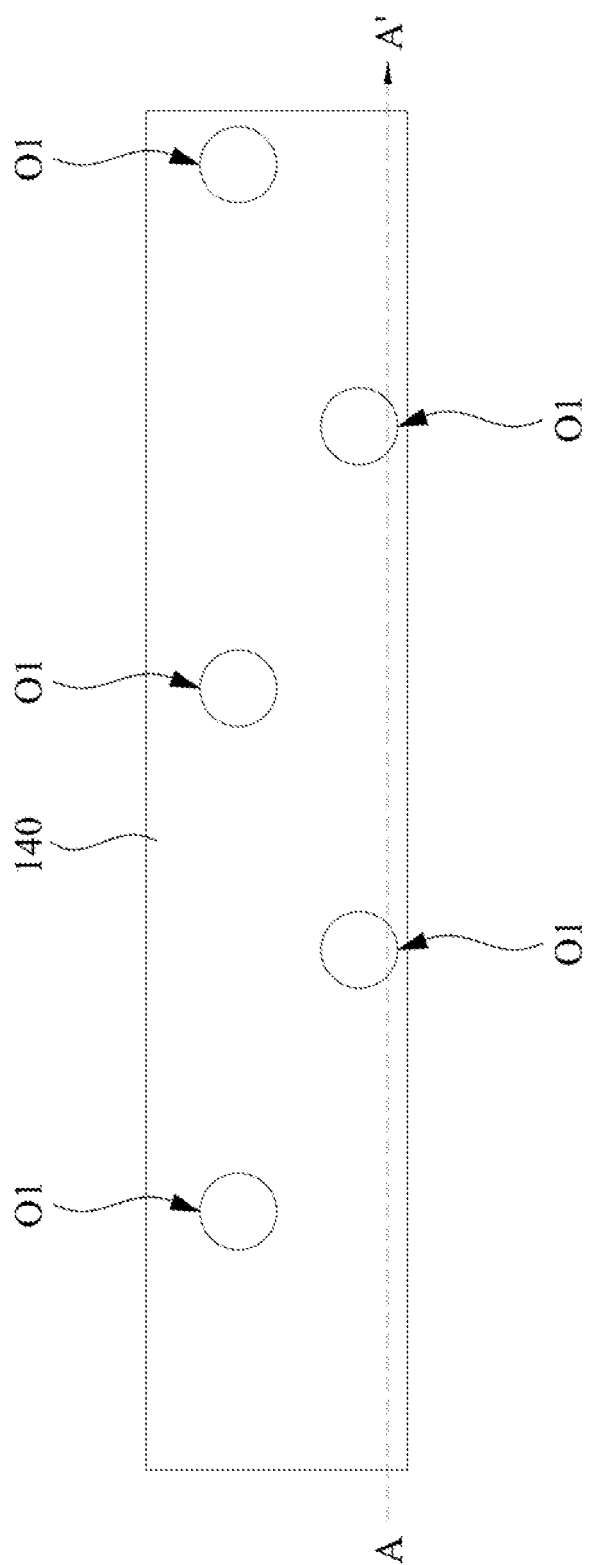
FIG. 5 is a top view of an intermediate stage of manufacturing the semiconductor device in accordance with an embodiment of present disclosure.
Figure 6:
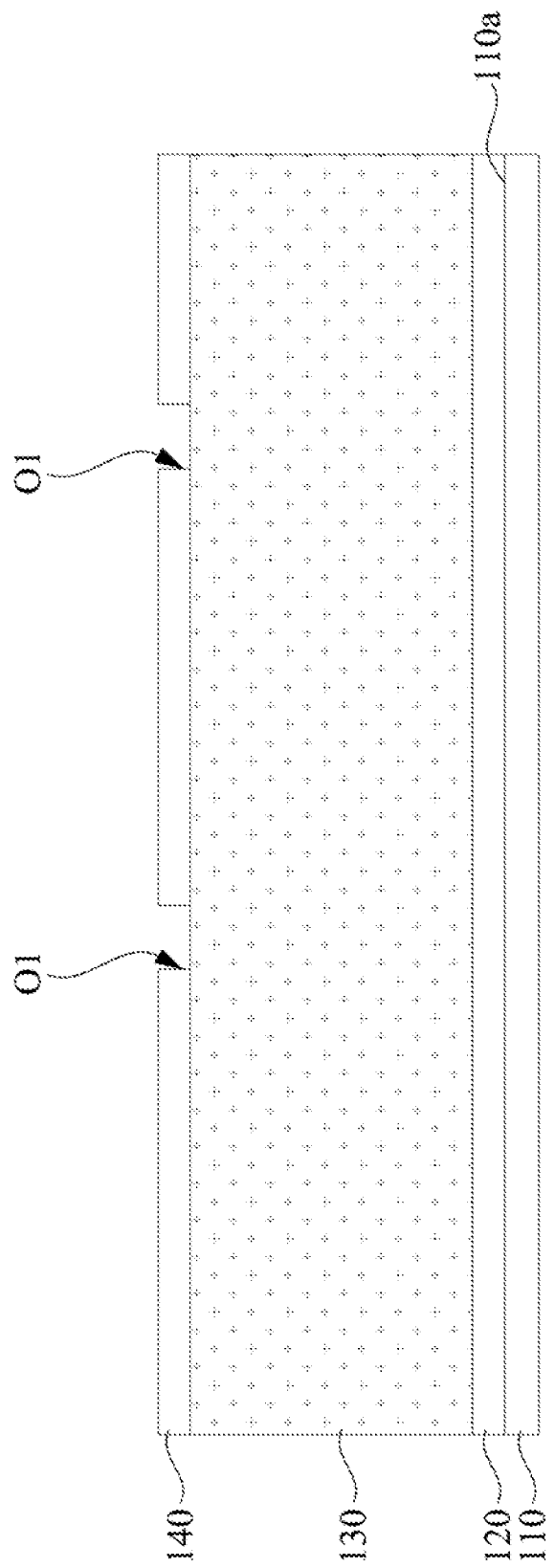
FIG. 6 is a cross-sectional view along a section A-A' shown in FIG. 5 of an intermediate stage of manufacturing the semiconductor device in accordance with an embodiment of present disclosure.

Reference is made to FIG. 1, FIG. 5, and FIG. 6. FIG. 5 is a top view of an intermediate stage of manufacturing the semiconductor device 100 in accordance with an embodiment of present disclosure, whereas FIG. 6 is a cross-sectional view along a section A-A' shown in FIG. 5 of an intermediate stage of manufacturing the semiconductor device 100 in accordance with an embodiment of present disclosure. As shown in FIG. 6, the first openings O1 are formed on the second supporting layer 140. Specifically, the first openings O1 run through the second supporting layer 140, so that the first mold layer 130 is exposed.

In some embodiments, the first openings O1 may be formed by any suitable method, for example, wet etching, dry etching, or the like. In some embodiments, the first openings O1 may be formed by dry etching using a patterned photoresist or hardmask. The present disclosure is not intended to limit the methods of forming the first openings O1.

In some embodiments, the first openings O1 have a circular shape in a top view, as shown in FIG. 5. The present disclosure is not intended to limit the shape of the first openings O1.

In step S103, a second mold layer 150 and a third supporting layer 160 are sequentially formed on the second supporting layer 140 including the first openings O1.

Figure 7:
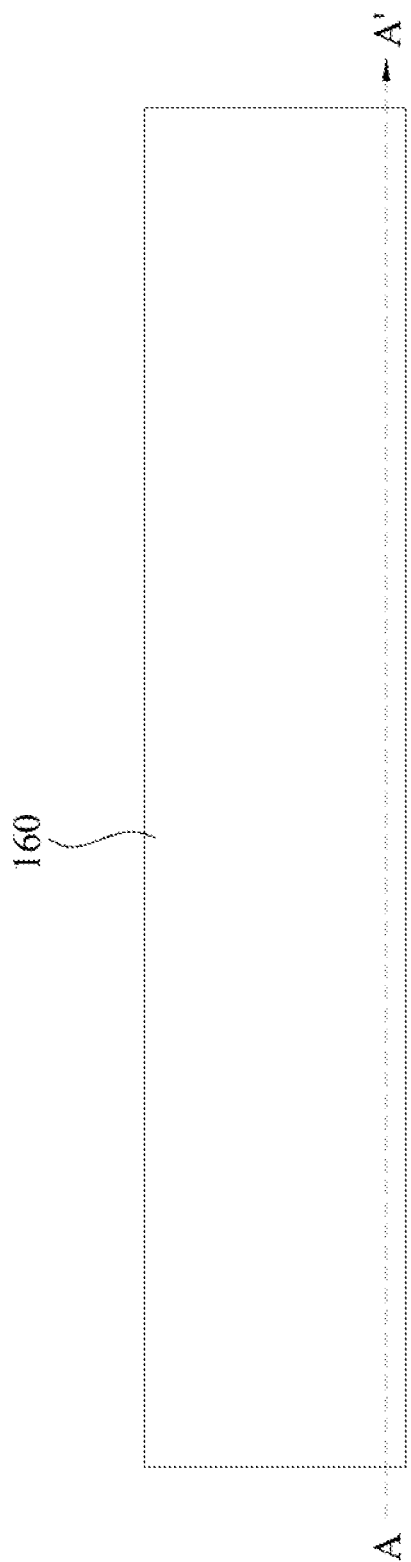
FIG. 7 is a top view of an intermediate stage of manufacturing the semiconductor device in accordance with an embodiment of present disclosure.
Figure 8:
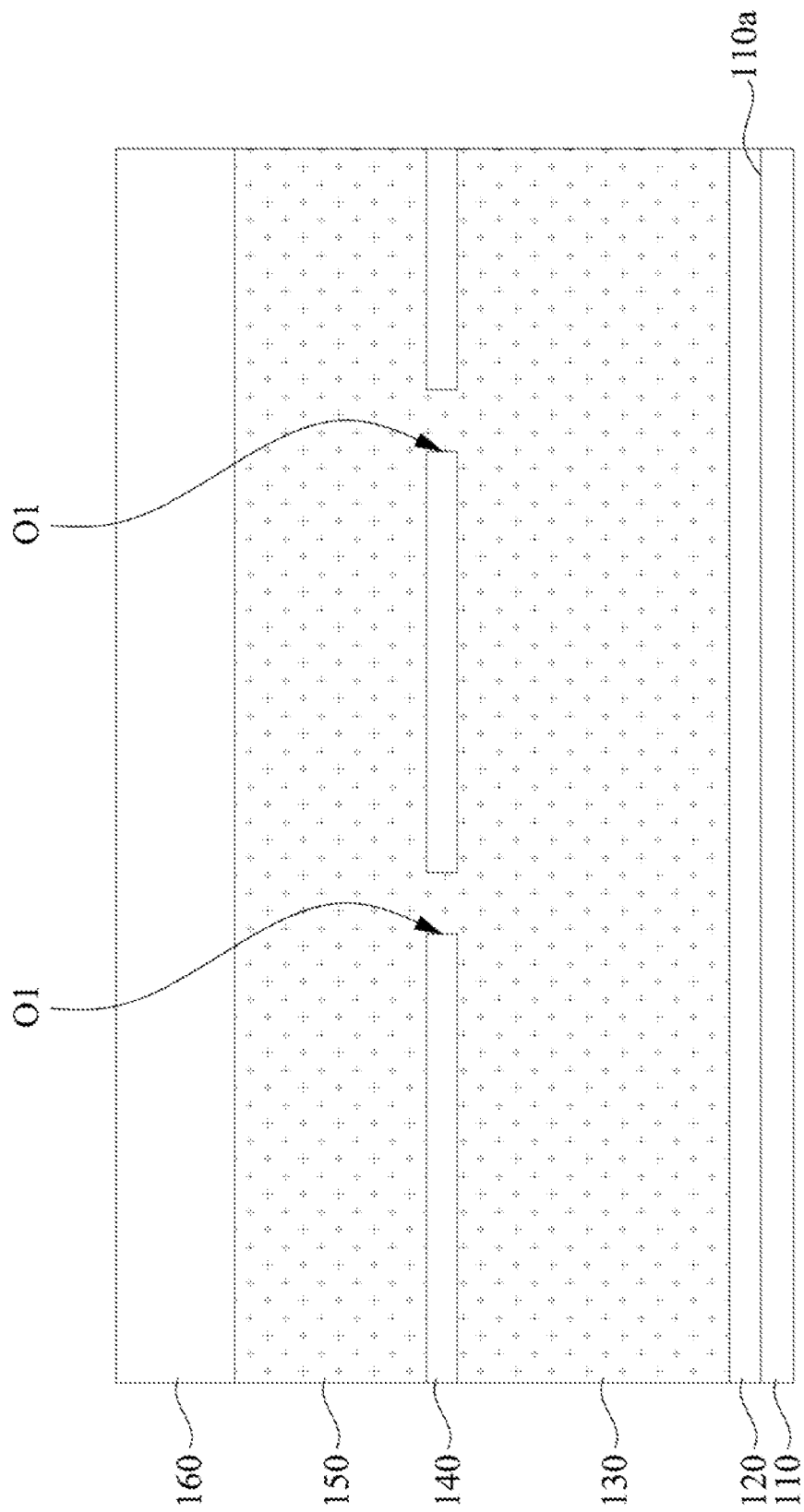
FIG. 8 is a cross-sectional view along a section A-A' shown in FIG. 7 of an intermediate stage of manufacturing the semiconductor device in accordance with an embodiment of present disclosure.

Reference is made to FIG. 1, FIG. 7, and FIG. 8. FIG. 7 is a cross-sectional view of an intermediate stage of manufacturing a semiconductor device 100 in accordance with an embodiment of the present disclosure, whereas FIG. 8 is a cross-sectional view along a section A-A' shown in FIG. 7 of an intermediate stage of manufacturing the semiconductor device 100 in accordance with an embodiment of present disclosure. As shown in FIG. 8, the second mold layer 150 is formed on the second supporting layer 140, so that the first openings O1 of the second supporting layer 140 are filled with the second mold layer 150 during the step S103. In some embodiments, the second mold layer 150 is in contact with the first mold layer 130. Subsequently, the third supporting layer 160 is formed on the second mold layer 150, so that the second mold layer 150 is formed sandwiched between the second supporting layer 140 and the third supporting layer 160, as shown in FIG. 7 and FIG. 8.

In some embodiments, the second mold layer 150 may include an oxide material, such as silicon oxide ($SiO_2$). However, any suitable material may be utilized.

In some embodiments, the second mold layer 150 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the second mold layer 150.

In some embodiments, the third supporting layer 160 may include a nitride material, such as silicon nitride ($Si_xN_y$). However, any suitable material may be utilized.

In some embodiments, the third supporting layer 160 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the third supporting layer 160.

In some embodiments, the material of the second mold layer 150 is identical to the material of the first mold layer 130.

In some embodiments, the material of the third supporting layer 160 is identical to the material of the second supporting layer 140.

In step S104, a plurality of second openings O2 are formed on the third supporting layer 160 to expose the second mold layer 150.

Figure 9:
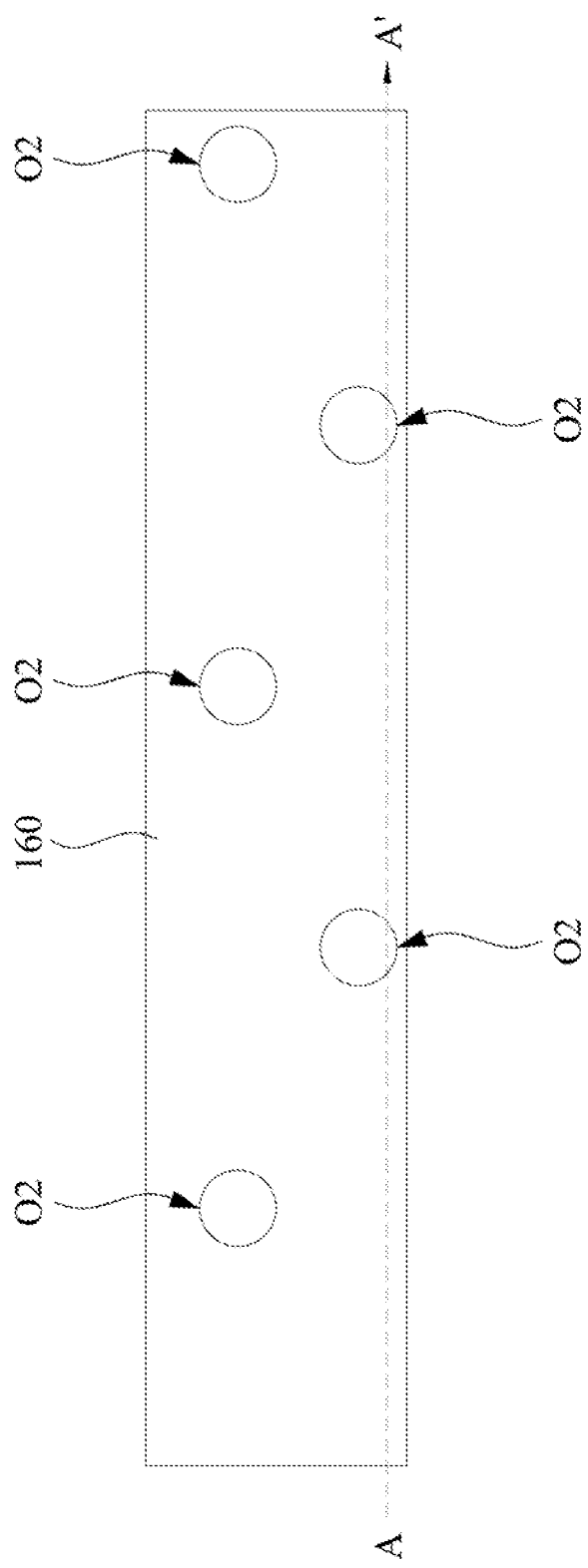
FIG. 9 is a top view of an intermediate stage of manufacturing the semiconductor device in accordance with an embodiment of present disclosure.
Figure 10:
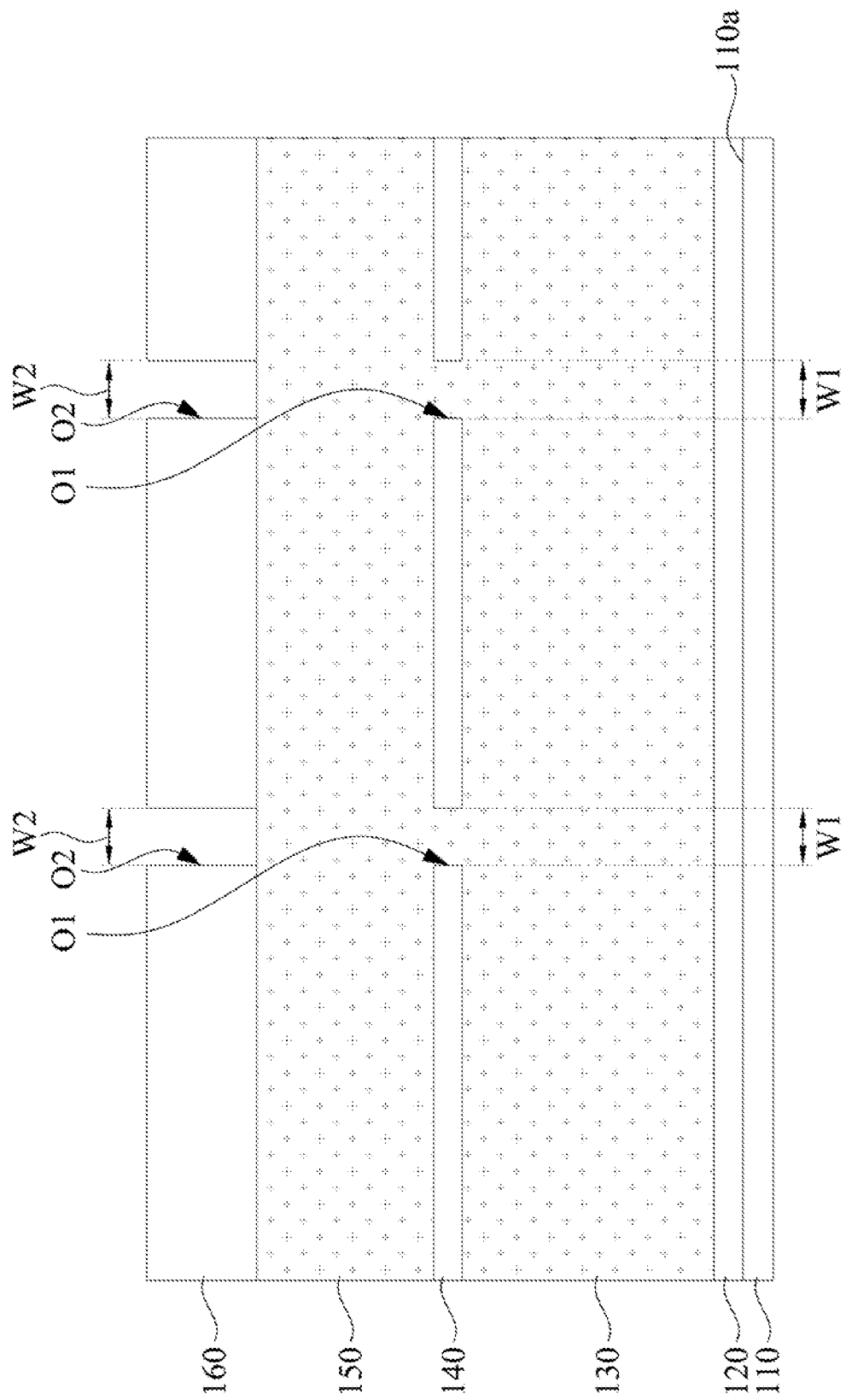
FIG. 10 is a cross-sectional view along a section A-A' shown in FIG. 9 of an intermediate stage of manufacturing the semiconductor device in accordance with an embodiment of present disclosure.

Reference is made to FIG. 2, FIG. 9, and FIG. 10. FIG. 9 is a top view of an intermediate stage of manufacturing the semiconductor device 100 in accordance with an embodiment of present disclosure, whereas FIG. 10 is a cross-sectional view along a section A-A' shown in FIG. 9 of an intermediate stage of manufacturing the semiconductor device 100 in accordance with an embodiment of present disclosure. As shown in FIG. 10, the second openings O2 are formed on the third supporting layer 160. Specifically, the second openings O2 run through the third supporting layer 160, so that the second mold layer 150 is exposed.

In some embodiments, the second openings O2 may be formed by any suitable method, for example, wet etching, dry etching, or the like. In some embodiments, the second openings O2 may be formed by dry etching using a patterned photoresist or hardmask. The present disclosure is not intended to limit the methods of forming the second openings O2.

In some embodiments, the second openings O2 have a circular shape in a top view, as shown in FIG. 9. The present disclosure is not intended to limit the shape of the second openings O2.

In some embodiments, each of the second openings O2 are formed directly above each of the first openings O1, as shown in FIG. 10. In some embodiments, each of the second openings O2 overlap each of the first openings O1. In some embodiments, each of the second openings O2 are aligned with each of the first openings O1 in the top view shown in FIG. 9. In some embodiments, a width W1 of each of the first openings O1 is identical to a width W2 of each of the second openings O2, as shown in FIG. 10.

In step S105, a mold material 170 is filled in the second openings O2.

Figure 11:
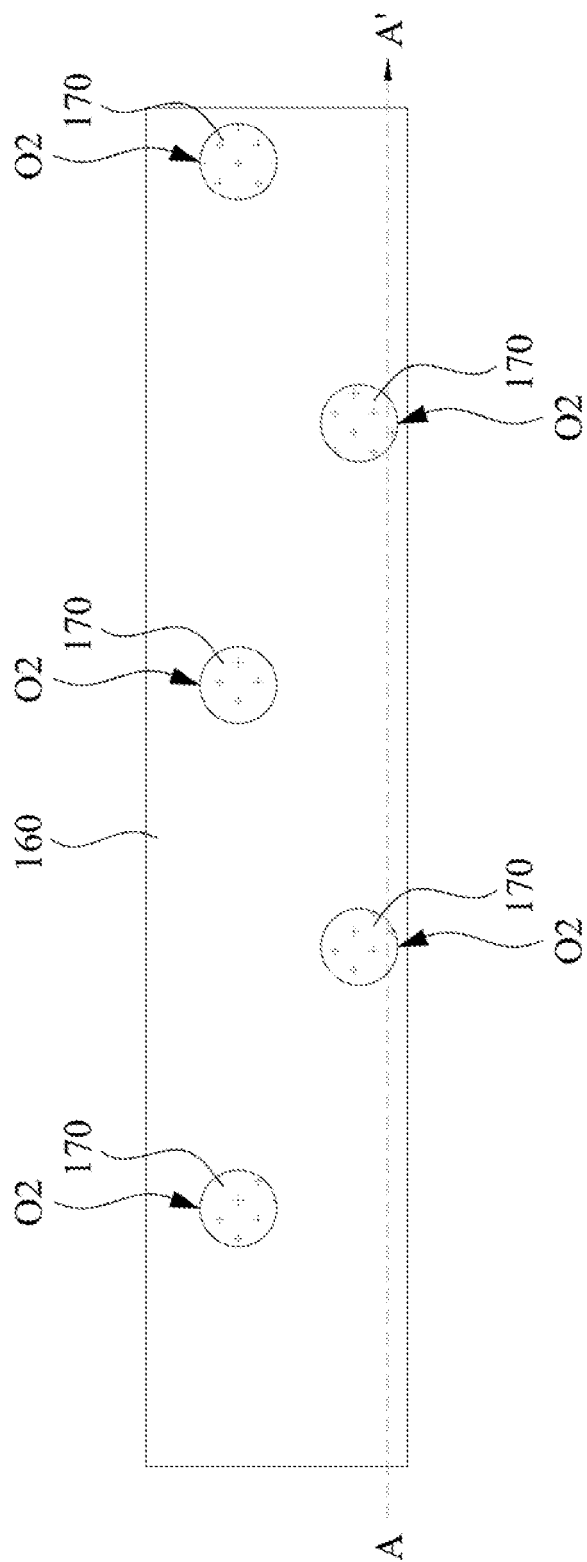
FIG. 11 is a top view of an intermediate stage of manufacturing the semiconductor device in accordance with an embodiment of present disclosure.
Figure 12:
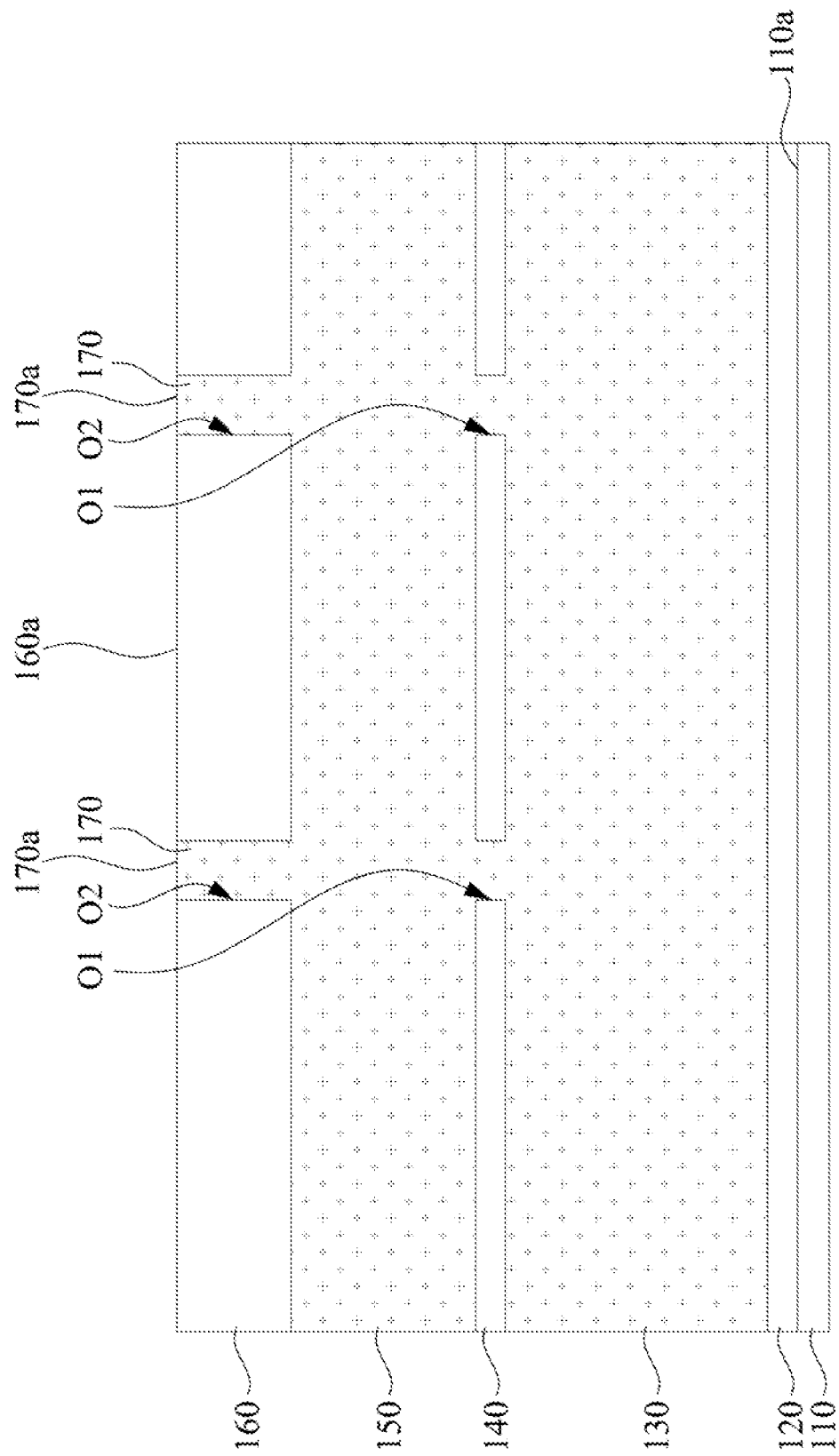
FIG. 12 is a cross-sectional view along a section A-A' shown in FIG. 11 of an intermediate stage of manufacturing the semiconductor device in accordance with an embodiment of present disclosure.

Reference is made to FIG. 2, FIG. 11, and FIG. 12. FIG. 11 is a cross-sectional view of an intermediate stage of manufacturing a semiconductor device 100 in accordance with an embodiment of the present disclosure, whereas FIG. 12 is a cross-sectional view along a section A-A' shown in FIG. 11 of an intermediate stage of manufacturing the semiconductor device 100 in accordance with an embodiment of present disclosure. As shown in FIG. 12, the mold material 170 is formed in the second openings O2 of the third supporting layer 160. In some embodiments, the step S105 further comprises overfilling the mold material 170 in the second openings O2. Subsequently, the mold material 170 is planarized after overfilling the mold material 170 in the second openings O2, so that the first openings O2 of the third supporting layer 160 are filled with the mold material 170 during the step S105. In some embodiments, the mold material 170 is planarized, so that the mold material 170 is leveled with the third supporting layer 160, as shown in FIG. 12. In some embodiments, an upper surface 170a of the mold material 170 is coplanar with an upper surface 160a of the third supporting layer 160, as shown in FIG. 12.

In some embodiments, the mold material 170 may include an oxide material, such as silicon oxide ($SiO_2$). However, any suitable material may be utilized.

In some embodiments, the mold material 170 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the mold material 170.

In some embodiments, the mold material 170 is identical to the second mold layer 150. Specifically, the material of the mold material 170 is identical to the material of the second mold layer 150. In some embodiments, the material of the first mold layer 130, the material of the second mold layer 150, and the material of the mold material 170 are identical.

In step S106, a plurality of trenches T are formed to expose the substrate 110.

Figure 13:
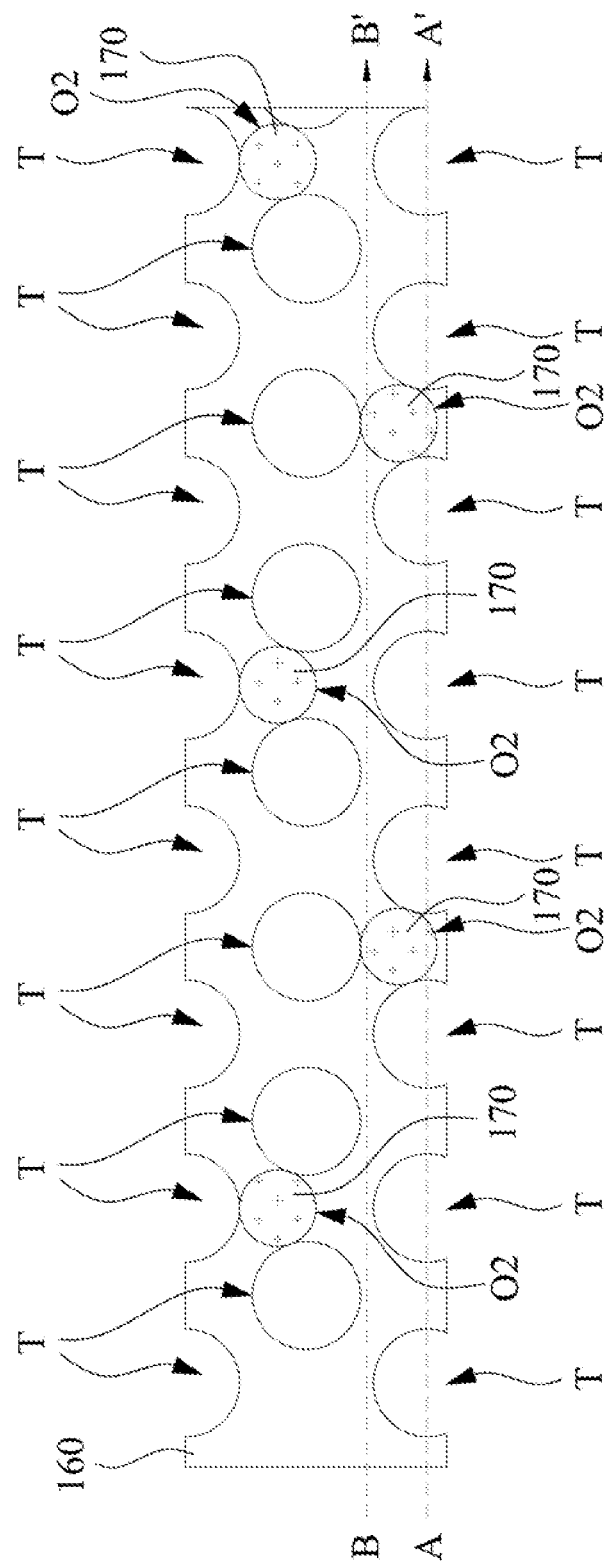
FIG. 13 is a top view of an intermediate stage of manufacturing the semiconductor device in accordance with an embodiment of present disclosure.
Figure 14:
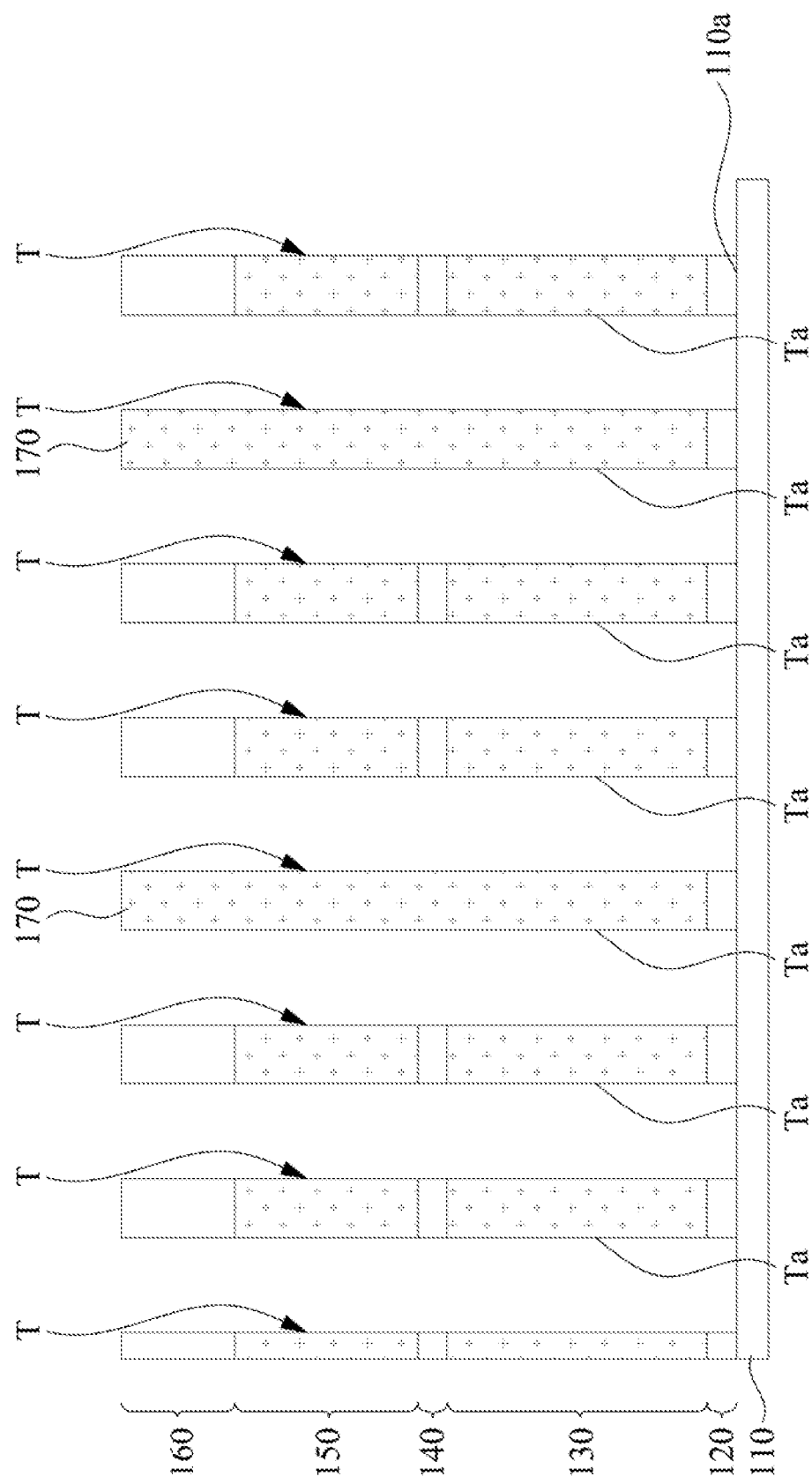
FIG. 14 is a cross-sectional view along a section A-A' shown in FIG. 13 of an intermediate stage of manufacturing the semiconductor device in accordance with an embodiment of present disclosure.

Reference is made to FIG. 2, FIG. 13, and FIG. 14. FIG. 13 is a top view of an intermediate stage of manufacturing the semiconductor device 100 in accordance with an embodiment of present disclosure, whereas FIG. 14 is a cross-sectional view along a section A-A' shown in FIG. 13 of an intermediate stage of manufacturing the semiconductor device 100 in accordance with an embodiment of present disclosure. As shown in FIG. 13, the trenches T are formed around the second openings O2. In some embodiments, each of the second openings O2 at least filled with the mold material 170 is surrounded by the trenches T in a top view shown in FIG. 13. In some embodiments, each of the second openings O2 is surrounded by three of the trenches T, as shown in FIG. 13, but the present disclosure is not intended to limit the number of the trenches T surrounding each of the second openings O2. In some embodiments, the three of the trenches T are respectively tangent to each of the second openings O2 in the top view shown in FIG. 13. In some embodiments, the three of the trenches T are separated from each of the second openings O2 at least filled with the mold material 170, and the trenches T are separated to each other. As shown in FIG. 14, the trenches T run through the third supporting layer 160, the second mold layer 150, the second supporting layer 140, the first mold layer 130, and the first supporting layer 120, so that the substrate 110 is exposed. As shown in FIG. 14, the trenches T have inner sidewalls Ta.

In some embodiments, a section B-B' of FIG. 13 is similar to FIG. 12 (i.e., the section A-A' of FIG. 11), so it is not described in further detail herein.

In some embodiments, the trenches T may be formed by any suitable method, for example, wet etching, dry etching, or the like. In some embodiments, the trenches T may be formed by dry etching using a patterned photoresist or hard mask. The present disclosure is not intended to limit the methods of forming the trenches T.

In some embodiments, the trenches T have a circular shape in a top view, as shown in FIG. 13. The present disclosure is not intended to limit the shape of the trenches T.

In step S107, a conductive layer 180 is formed on the inner sidewalls Ta of the trenches T to conform the trenches T.

Figure 15:
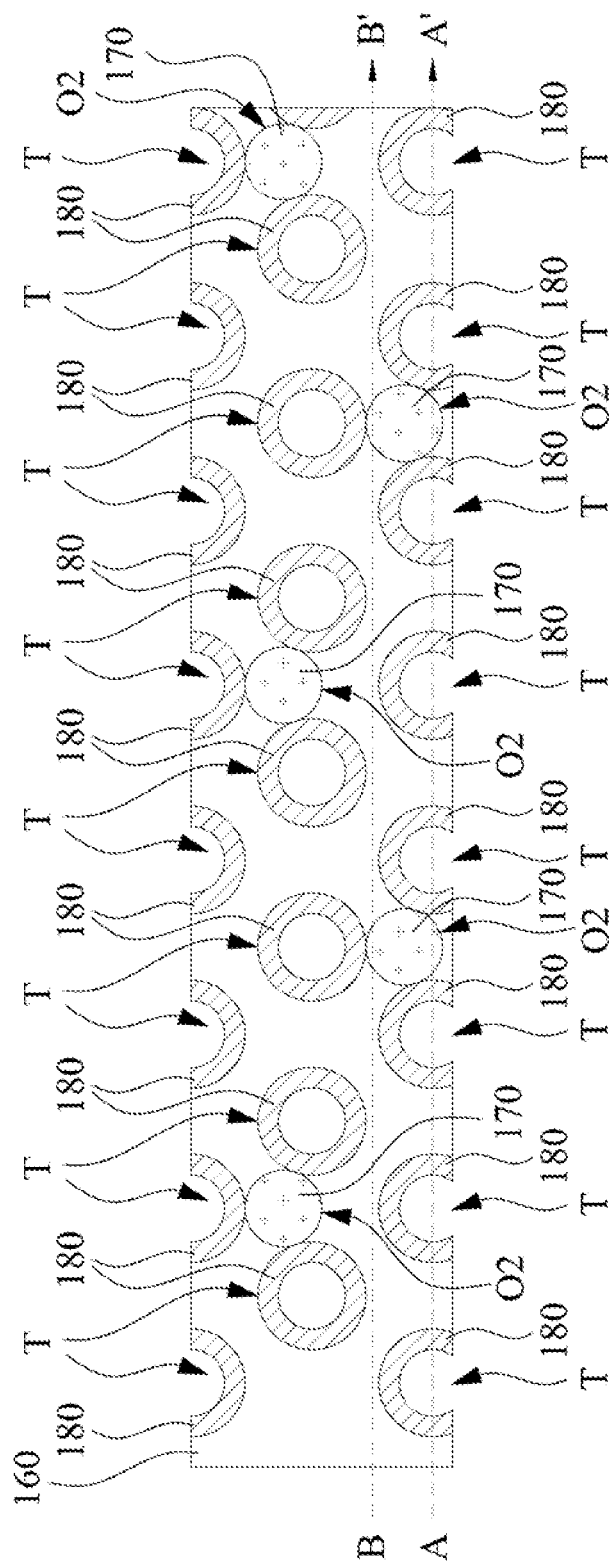
FIG. 15 is a top view of an intermediate stage of manufacturing the semiconductor device in accordance with an embodiment of present disclosure.
Figure 16:
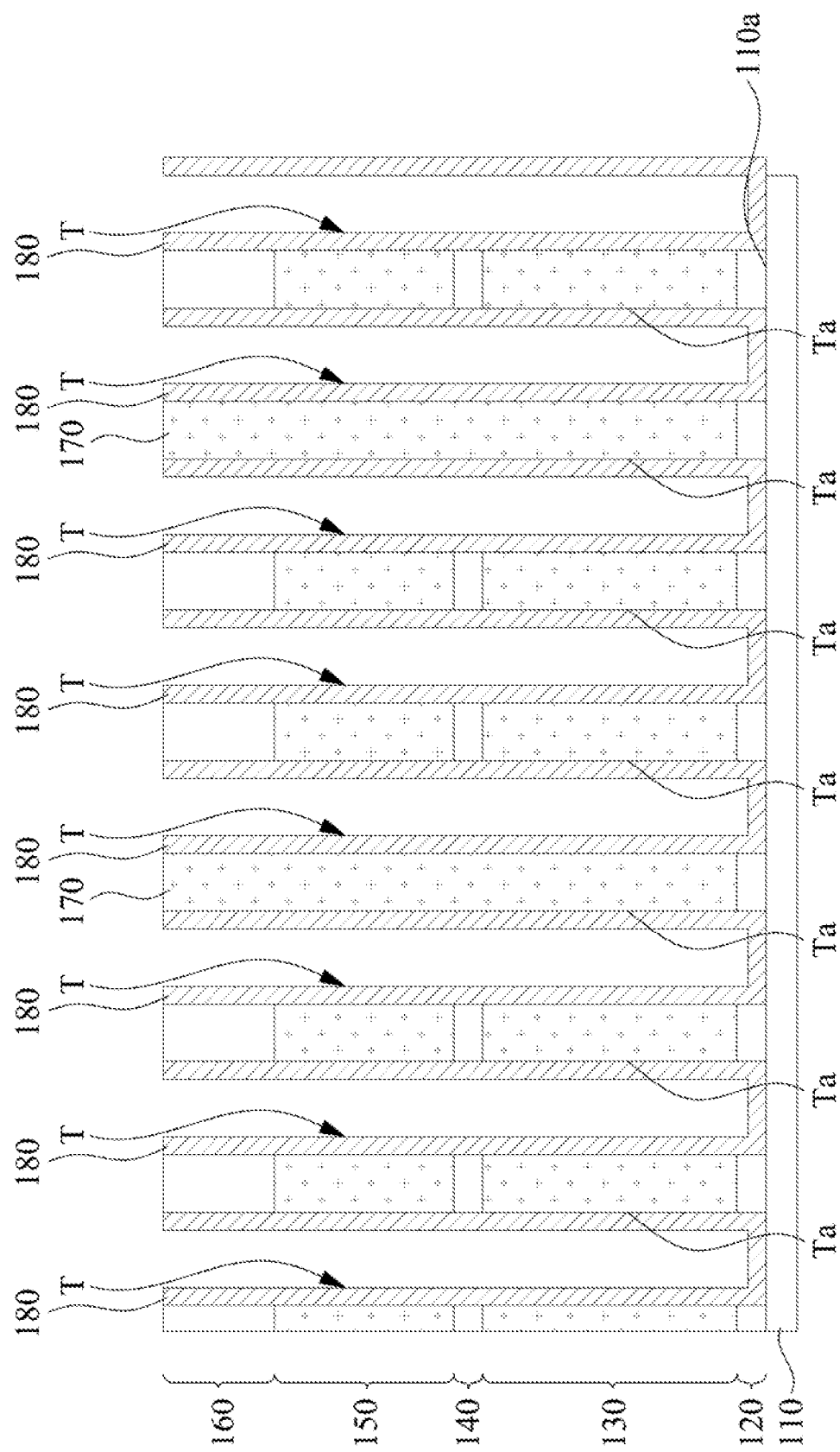
FIG. 16 is a cross-sectional view along a section A-A' shown in FIG. 15 of an intermediate stage of manufacturing the semiconductor device in accordance with an embodiment of present disclosure.
Figure 17:
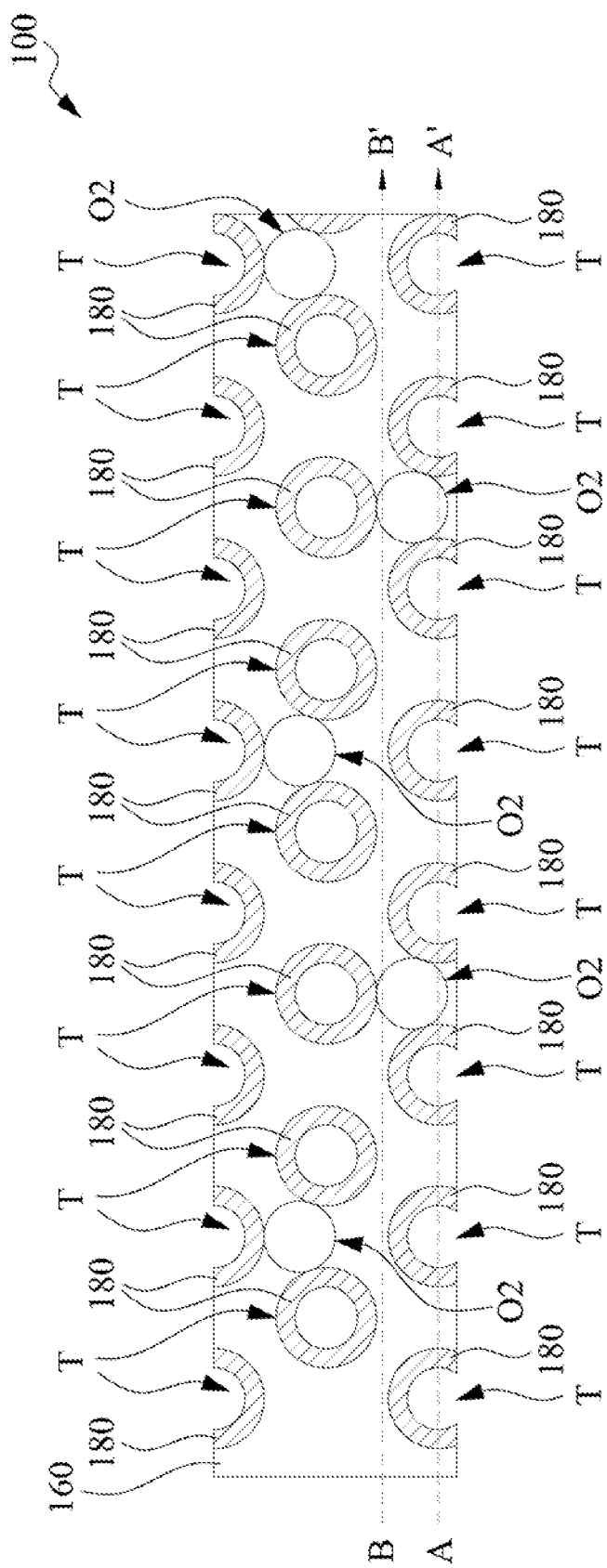
FIG. 17 is a top view of an intermediate stage of manufacturing the semiconductor device in accordance with an embodiment of present disclosure.

Reference is made to FIG. 2, FIG. 15, and FIG. 16. FIG. 15 is a cross-sectional view of an intermediate stage of manufacturing a semiconductor device 100 in accordance with an embodiment of the present disclosure, whereas FIG. 16 is a cross-sectional view along a section A-A' shown in FIG. 15 of an intermediate stage of manufacturing the semiconductor device 100 in accordance with an embodiment of present disclosure. As shown in FIG. 15 and FIG. 16, the conductive layer 180 is formed on the inner sidewalls Ta of the trenches T. In some embodiments, the trenches T are lined with the conductive layer 180, as shown in FIG. 16. Specifically, the conductive layer 180 is conformally formed on the inner sidewalls Ta of the trenches T. As shown in FIG. 16, the conductive layer 180 covers portions of the substrate 110 communicating the trenches T. In some embodiments, the step S107 further comprises removing portions of the conductive layer 180. The portions of the conductive layer 180 are removed, so that the third supporting layer 160 and the mold material 170 are exposed during the step S107, thereby separating the conductive layer 180. In some embodiments, the portions of the conductive layer 180 are located directly on the third supporting layer 160 and the mold material 170.

In some embodiments, a section B-B' of FIG. 15 is similar to FIG. 14 (i.e., the section B-B' of FIG. 13) and FIG. 12 (i.e., the section A-A' of FIG. 11), so it is not described in further detail herein.

In some embodiments, the conductive layer 180 is made of conductive material. In some embodiments, the conductive layer 180 may include a material, such as titanium nitride (TiN), titanium silicon nitride (TiSiN). However, any suitable material may be utilized.

In some embodiments, the conductive layer 180 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the conductive layer 180.

In some embodiments, the conductive layer 180 may be formed by a blanket deposition process.

In some embodiments, the portions of the conductive layer 180 may be removed by any suitable method, for example, chemical mechanical planarization (CMP) process, or the like. The present disclosure is not intended to limit the methods of removing the portions of the conductive layer 180.

In some embodiments, the first mold layer 130, the second mold layer 150, and the mold material 170 are patterned during the step S106 that the trenches T are formed. The patterned first mold layer 130, the second mold layer 150, and the mold material 170 are configured as a mold of depositing the conductive layer 180 in the step S107.

In some embodiments, the conductive layer 180 which is separated in step S107 is configured as a bottom electrode of the capacitor formed in subsequent processes.

In step S108, the mold material 170, the second mold layer 150, and the first mold layer 130 are removed.

Figure 18:
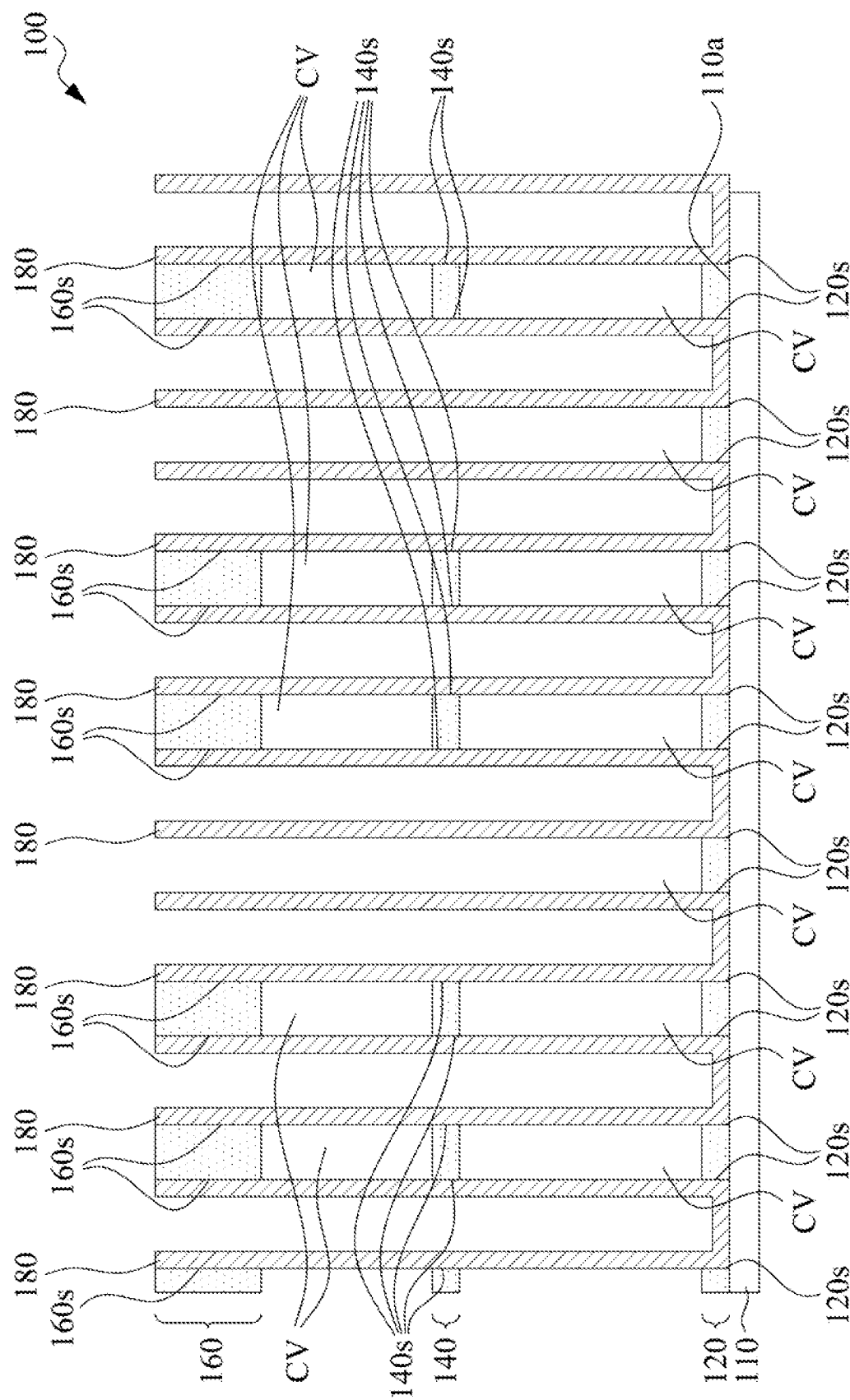
FIG. 18 is a cross-sectional view along a section A-A' shown in FIG. 17 of an intermediate stage of manufacturing the semiconductor device in accordance with an embodiment of present disclosure.

Reference is made to FIG. 2, FIG. 17, FIG. 18, and FIG. 19. FIG. 17 is a cross-sectional view of an intermediate stage of manufacturing a semiconductor device 100 in accordance with an embodiment of the present disclosure, FIG. 18 is a cross-sectional view along a section A-A' shown in FIG. 17 of an intermediate stage of manufacturing the semiconductor device 100 in accordance with an embodiment of present disclosure, and FIG. 19 is a cross-sectional view along a section B-B' shown in FIG. 17 of an intermediate stage of manufacturing the semiconductor device 100 in accordance with an embodiment of present disclosure. As shown in FIG. 17 and FIG. 18, the mold material 170, the second mold layer 150, and the first mold layer 130 are removed, so that a cavity CV is formed in where the mold material 170, the second mold layer 150, and the first mold layer 130 took place. As shown in FIG. 19, in some embodiments, the second supporting layer 140 and the first supporting layer 120 are separated by the cavity CV, and the third supporting layer 160 and the second supporting layer 140 are separated by the cavity CV. As shown in FIG. 16, the conductive layer 180 covers the surface 110a of the substrate 110 and disposed on sidewalls 120s of the first supporting layer 120, sidewalls 140s of the second supporting layer 140, and sidewalls 160s of the third supporting layer 160, as shown in FIG. 18. In some embodiments, the conductive layer 180 runs through the cavity CV, as shown in FIG. 18. In some embodiments, the step S107 further comprises removing portions of the conductive layer 180. The portions of the conductive layer 180 are removed, so that the third supporting layer 160 and the mold material 170 are exposed during the step S107. In some embodiments, the portions of the conductive layer 180 are located directly on the third supporting layer 160 and the mold material 170.

In some embodiments, the mold material 170, the second mold layer 150, and the first mold layer 130 may be removed by any suitable method, for example, etching process, or the like. In some embodiments, the mold material 170, the second mold layer 150, and the first mold layer 130 are removed by performing wet etching process. In some embodiments, the mold material 170, the second mold layer 150, and the first mold layer 130 may be removed using hydrofluoric acid (HF). The present disclosure is not intended to limit the methods of removing the mold material 170, the second mold layer 150, and the first mold layer 130.

In some embodiments, the first supporting layer 120, the second supporting layer 140, the third supporting layer 160, and the conductive layer 180 are configured as a supporting structure of the semiconductor device 100, and also, configured as containers of the capacitors formed in subsequent processes.

In some embodiments, the conductive layer 180 shown in step S108 is configured to provide a support for the second supporting layer 140 and the third supporting layer 160 as the mold material 170, the second mold layer 150, and the first mold layer 130 are removed during step S108.

By performing the method M shown in FIG. 1 and FIG. 2 of the present disclosure, the semiconductor device 100 with better electrical performance may be formed.

Based on the above discussions, it can be seen that in the semiconductor device and the method of manufacturing the same of present disclosure, since the third supporting layer dry etch and the second supporting layer dry etch after bottom electrode deposition are excluded, the conductive layer is no longer consumed, thereby improving cell capacitance of the DRAM. In the semiconductor device and the method of manufacturing the same of present disclosure, since no extra third supporting layer is etched after the conductive layer deposition, the structure of the capacitors will be stronger to avoid capacitor to capacitor short issue, thereby improving its electrical performance.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor device, comprising:
   sequentially forming a first supporting layer, a first mold layer, and a second supporting layer on a surface of a substrate, wherein the first mold layer is formed sandwiched between the first supporting layer and the second supporting layer;
   forming a plurality of first openings on the second supporting layer to expose the first mold layer;
   sequentially forming a second mold layer and a third supporting layer on the second supporting layer including the first openings, so that the second mold layer contacts the first mold layer;
   forming a plurality of second openings on the third supporting layer to expose the second mold layer, wherein the second openings are formed directly above the first openings;
   filling a mold material in the second openings, wherein the mold material is identical to the second mold layer;
   forming a plurality of trenches to expose the substrate, wherein the trenches run through the first supporting layer, the first mold layer, the second supporting layer, the second mold layer, and the third supporting layer, and the trenches are separated from the second openings;
   conformally forming a conductive layer on inner sidewalls of the trenches; and
   removing the mold material, the second mold layer, and the first mold layer.

2. The method of claim 1, wherein the second openings are respectively aligned with the first openings in a direction substantially perpendicular to the surface of the substrate.

3. The method of claim 1, wherein a material of the first mold layer is identical to a material of the second mold layer.

4. The method of claim 1, wherein each of the second openings is surrounded by three of the trenches.

5. The method of claim 1, wherein filling the mold material in the second openings further includes:
   overfilling the mold material in the second openings; and
   planarizing the mold material, so that the mold material is leveled with the third supporting layer.

6. The method of claim 1, further comprising removing portions of the conductive layer to expose the third supporting layer and the mold material.

7. The method of claim 6, wherein removing the portions of the conductive layer is performed by a chemical mechanical planarization process.

8. The method of claim 1, wherein removing the mold material, the second mold layer, and the first mold layer is performed by a wet etch process.

9. A method of manufacturing a semiconductor device, comprising:
   sequentially forming a first supporting layer, a first mold layer, and a second supporting layer on a surface of a substrate, wherein the first mold layer is formed sandwiched between the first supporting layer and the second supporting layer;
   forming a plurality of first openings on the second supporting layer to expose the first mold layer;
   sequentially forming a second mold layer and a third supporting layer on the second supporting layer including the first openings, so that the second mold layer contacts the first mold layer;
   forming a plurality of second openings on the third supporting layer to expose the first mold layer, wherein the second openings are formed directly above the first openings;
   filling a mold material in the second openings, wherein the mold material is identical to the second mold layer;
   forming a plurality of trenches to expose the substrate, wherein the trenches are separated from the second openings, wherein each of the second openings is surrounded by three of the trenches;
   conformally forming a conductive layer on inner sidewalls of the trenches; and
   removing the mold material, the second mold layer, and the first mold layer.

10. The method of claim 9, wherein the second openings are respectively aligned with the first openings in a direction substantially perpendicular to the surface of the substrate.

11. The method of claim 9, wherein a material of the first mold layer is identical to a material of the second mold layer.

12. The method of claim 11, wherein the first mold layer, the second mold layer, and the mold material are made of oxide.

13. The method of claim 9, wherein the trenches run through the first supporting layer, the first mold layer, the second supporting layer, the second mold layer, and the third supporting layer.

14. The method of claim 9, wherein filling the mold material in the second openings further includes:
   overfilling the mold material in the second openings; and
   planarizing the mold material, so that the mold material is leveled with the third supporting layer.

15. The method of claim 9, further comprising removing portions of the conductive layer to expose the third supporting layer and the mold material, wherein removing the portions of the conductive layer is performed by a chemical mechanical planarization process.

16. The method of claim 9, wherein removing the mold material, the second mold layer, and the first mold layer is performed by a wet etch process.

* * * * *